(12) United States Patent
Hwang et al.

(10) Patent No.: US 7,085,702 B1
(45) Date of Patent: Aug. 1, 2006

(54) METHOD AND SYSTEM FOR MODELING AND AUTOMATICALLY GENERATING AN EMBEDDED SYSTEM FROM A SYSTEM-LEVEL ENVIRONMENT

(75) Inventors: L. James Hwang, Menlo Park, CA (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 783 days.

(21) Appl. No.: 10/180,857

(22) Filed: Jun. 25, 2002

Related U.S. Application Data

(63) Continuation-in-part of application No. 09/981,503, filed on Oct. 16, 2001.

(51) Int. Cl.
- *G06G 17/50* (2006.01)
- *G11C 29/54* (2006.01)
- *G06F 1/08* (2006.01)
- *G06F 1/04* (2006.01)
- *G06F 1/06* (2006.01)
- *H03K 19/00* (2006.01)

(52) U.S. Cl. .......................... 703/15; 703/18; 703/14; 326/93; 327/291; 327/100

(58) Field of Classification Search ................ 703/15, 703/13
See application file for complete search history.

(56) References Cited

U.S. PATENT DOCUMENTS

| | | | |
|---|---|---|---|
| 5,867,400 A * | 2/1999 | El-Ghoroury et al. | 716/1 |
| 6,053,947 A * | 4/2000 | Parson | 703/14 |
| 6,389,379 B1 * | 5/2002 | Lin et al. | 703/14 |
| 6,427,224 B1 * | 7/2002 | Devins et al. | 716/4 |
| 2004/0143801 A1 * | 7/2004 | Water et al. | 716/3 |

OTHER PUBLICATIONS

Peter Zepter, Thorston Grotker, Heinrich Meyr, Digital Receiver Design Using VHDL Generation From Data Flow Graphs, 1995, ACM, 32nd ACM/IEEE Design Automation Conference, 6 pgs.*

Michael R. Sturgill et al.; "Design and Verification of Third Generation Wireless Communication Systems"; White Paper, Cadence Design Systems, Inc.; Dec. 18, 2000; pp. 1-10.

* cited by examiner

*Primary Examiner*—Kamini Shah
*Assistant Examiner*—Suzanne Lo
(74) *Attorney, Agent, or Firm*—Leroy D. Maunu

(57) ABSTRACT

Method and system for modeling and automatically generating an embedded system from a system-level environment. A plurality of user-selectable system-level design objects are provided in the system-level environment. Each system-level design object is defined by a system-level function and is selectable by a system-level designer. A plurality of hardware-level design objects are also provided. Each hardware-level design object is configured to generate a hardware definition of a hardware-level function. Each system-level design object maps to one or more hardware-level design objects. A processor design object is provided which defines a processor. In response to selections made by the designer, a system-level design is instantiated in a system-level design file. The system-level design includes user-selected ones of the system-level and processor design objects. The system simulates behavior of the system-level design consistent with the processor, system-level functions, and behavior of a hardware definition from the hardware-level design objects that implement the user-selected ones of the system-level design objects.

16 Claims, 4 Drawing Sheets

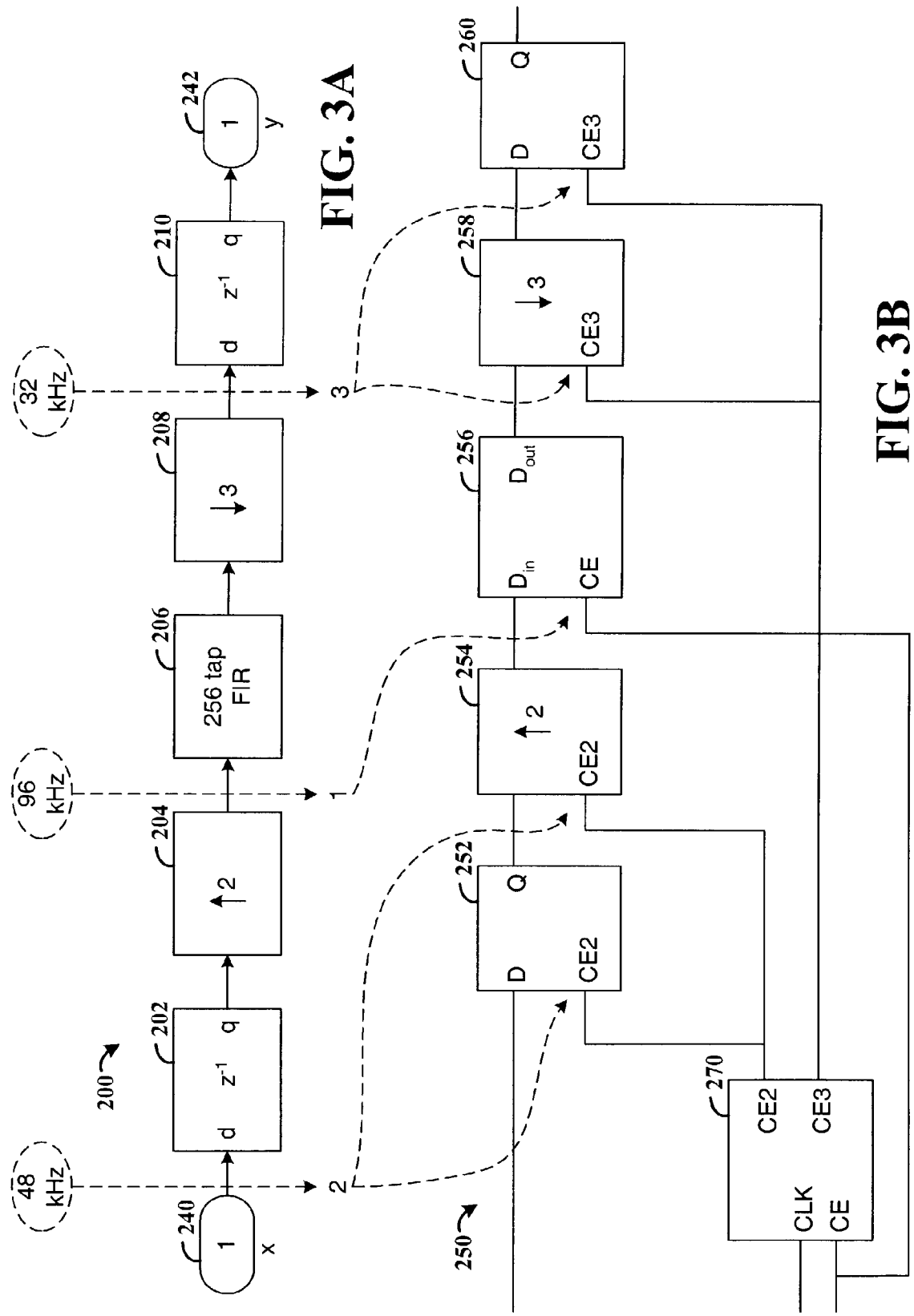

METHOD AND SYSTEM FOR MODELING AND AUTOMATICALLY GENERATING AN EMBEDDED SYSTEM FROM A SYSTEM-LEVEL ENVIRONMENT

This application is a continuation-in-part of U.S. patent application Ser. No. 09/981,503, filed Oct. 16, 2001.

FIELD OF THE INVENTION

The present invention generally relates to electronic circuit design tools, and more particularly to a tool that supports system-level development and simulation of an embedded system design that is bit-true and cycle-true to a hardware implementation.

BACKGROUND

Modern electronic systems that are implemented in application-specific integrated circuits (ASICs), field-programmable integrated circuits (FPGAs), or complex programmable logic devices (CPLDs) are often extremely complex, requiring years of effort to realize. For this reason, it is common to decompose the design problem into phases: a specification phase in which the functional requirements of the system are defined, a modeling phase in which an executable version of the functional description is realized, and an implementation phase in which a hardware realization of the system is created. For the end result to be correct, each phase must faithfully implement the result of the previous phase. For example, the hardware realization must exactly mirror the functional model created during the modeling phase. In practice, validating that implementations are faithful, which is the greatest part the design effort, often exposes design flaws or faulty assumptions upstream. This, in turn, results in reworking the earlier design representation.

The modeling phase consists of capturing the design in an executable form, simulating, then analyzing the results. The modeling phase is appropriate for algorithm exploration, in which system parameters such as sample rates, data precision, and choice of functional blocks are decided. This process is iterative, with the results of analysis leading to revisions that allow system specifications to be met. In the modeling phase, a high level of abstraction is desirable in order to facilitate algorithm exploration. For example, it is common to represent arithmetic values using floating point or fixed point rather than as buses of logic signals. Sampled data systems are also most conveniently modeled by defining sample rates rather than using explicit interconnections ("wires") representing clock and associated control signals (e.g., enable, reset).

The implementation phase consists of creating a low-level hardware realization of the system in terms of primitives in an appropriate technology library. Hardware description languages such as VHDL and Verilog are commonly used for such a representation. In this representation, high level constructs such as sample rates and arithmetic values must be implemented in terms of clock signals and buses of logic vectors, and functional operators (e.g., discrete Fourier transform) must be mapped into appropriate circuitry. To achieve high performance, libraries of intellectual property (IP) blocks are commonly used. Such IP blocks are typically custom built to be efficient in the target technology.

In traditional system design flows, the system designer is responsible for creating both the system model and the hardware realization. Moreover, the designer must ensure that the hardware realization meets the system specification. This validation can be extremely time-consuming, especially if redesign of the system model is required.

For high-level modeling of digital systems, a visual data flow paradigm has been found to be well suited and widely adopted by system architects. In a data flow model, the system is represented as a network of functional operators that process data carried by signals between the operators. Since many algorithms are naturally specified by signal flow graphs, the topology of a visual data flow model often closely resembles the algorithm specification. Specifying a system in a visual data flow environment is in some ways similar to specifying a design in a traditional schematic capture tool. Visual data flow environments provide a block editor, which can be used to construct models by connecting elements selected from libraries of functional blocks. In contrast to schematic tools, however, the library blocks and the simulation environment in a data flow tool provide a high level of functional abstraction, with polymorphic data types and operators to model arithmetic operations on integer, fixed-point, and floating-point data. Time evolution is typically specified by sample rates rather than by wiring explicit clocks.

Although previous design flow environments support system-level modeling, the costs associated with the high level of abstraction include "simulation only" models having no automatically generated realization of the system model, inefficient hardware implementations that preserve functional correctness, and inexact modeling of the hardware in the system-level simulation. Prior existing visual data flow environments have been suitable for system modeling (i.e., specification and simulation), but have not provided automatic generation of a hardware realization of the system model. Instead, a typical design flow involves a manual translation of the system model to a hardware realization (e.g., ASIC or FPGA), and a manual verification that ensures the hardware faithfully implements the system model.

For example, the commercial visual data flow environment, SPW, from Cadence, provides simulation libraries and target implementations. However, the user is required to manually create the hardware implementation by explicitly replacing simulation models by the target library elements. This process is non-trivial, since replacement can involve one-to-many mapping (architectural synthesis, including re-timing and hardware sharing), as well as synthesis of additional circuitry for inferred control logic (handshaking and clocking).

Designing and debugging an embedded system presents even more challenges. An embedded system is a system that includes one or more microprocessors that communicate with other electronic system circuitry, which is usually application-specific. In addition to the challenges involved with creating high performance digital systems without microprocessors, the embedded system designer faces many other new problems. For example, concurrent interactions between a microprocessor and surrounding hardware are common and must be mediated, often without the help of an operating system. In addition, because a microprocessor can interact directly with hardware, it can be difficult for the designer to simulate the conditions in which the microprocessor's software is running and to observe the results produced.

A method and system that supports both modeling and automatic generation of a faithful and efficient hardware realization are therefore desirable.

SUMMARY OF THE INVENTION

In various embodiments, the present invention provides a method and system for modeling and automatically generating an embedded system from a system-level environment. A plurality of user-selectable system-level design objects are provided in the system-level environment. Each system-level design object implements a system-level function and is selectable by a system-level designer. A plurality of hardware-level design objects are also provided. Each hardware-level design object is configured to generate a hardware definition of a hardware-level function. Each system-level design object maps into one or more hardware-level design objects. A specific form of system level design object germane to embedded systems is a processor design object, which provides a system level abstraction of a microprocessor. In response to selections made by the designer, a system is represented in a system-level design file. The system-level design includes user-selected instances of system-level and processor design objects. The system simulates behavior of the system-level design consistent with the processor, system-level functions, and behavior of a hardware definition from the hardware-level design objects that implement the user-selected ones of the system-level design objects.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 3A is a block diagram of an example system-level design of an electronic circuit, and FIG. 3B is a block diagram of a hardware implementation generated from the system-level design.

DETAILED DESCRIPTION

Figure 1A:
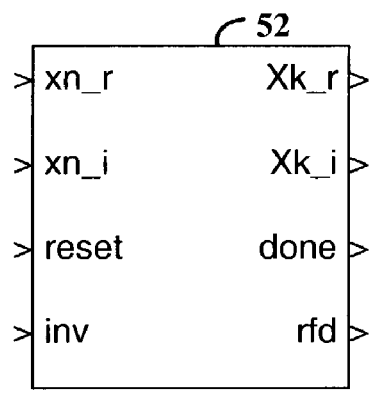
FIGS. 1A and 1B illustrate the difference between an example fast Fourier transform (FFT) operator in a system library and a FFT operator in a target hardware library.

The present invention is described in terms of system-level designs for embedded systems, including digital signal processing (DSP) applications and implementations for FPGAs. It will be appreciated, however, that the various concepts described herein, along with the various embodiments of the invention, can be applied to designs other than DSP systems and to implementation technologies other than FPGAs. The invention is applicable both to visual data flow modeling environments, and to other high-level design flows, e.g., based on a programming language such as C++.

The present invention addresses the validation problem by providing a mechanism for automatically generating a hardware realization from an embedded system model, thereby removing the necessity of verifying the equivalence of the two representations. In addition, a mechanism and methodology are provided for the automatic production of a verified hardware representation from a high-level system model. In various embodiments, the invention includes a system library, a target library, compiler, and various hardware and software simulators. The system library includes the functional operators in the system environment. The target library includes the implementations of the functional operators in the target hardware technology. The compiler translates a specified sequence of system library operations into a functionally corresponding circuit of interconnected components in the target library. The mapping of functional operations to implementation components may be one-to-one, one-to-many, or many-to-one. The hardware and software simulators simulate the embedded system including functions of a program to execute on the embedded processor and functions of the other hardware of the system.

The system library provides polymorphic arithmetic for floating-point, fixed-point, and integer operations. For quantization of data, the library supports various forms of saturation arithmetic and rounding. In each case, the target library provides equivalent data representations, although in hardware the values are represented as buses of standard logic vectors, with, for example, the binary point of a fixed point data representation being carried as an attribute (e.g., using VHDL generics). In the target library, floating point values may be realized by representing mantissas and exponents individually as buses of logic vectors. Functional operators are implemented as hardware design (sometimes referred to as "intellectual property") blocks that have been tailored for high efficiency. The realizations of functional operators may be in terms of software that runs on a processor design object as well as dedicated hardware design objects.

In addition to arithmetic abstraction that is mirrored in the target library, the system library elements implement handshaking protocols that allow data to flow through the system model without having explicit operators to control data transmission. In the target library, this functionality is, for example, realized through hardware in the blocks themselves and also through the injection of additional circuitry by the compiler. The system level design environment provides software code and necessary circuitry to interface hardware design objects with processor design objects. For example, the system level design environment generates a memory map and buffer memories to facilitate data transfer between the processor design object's view of a memory space and the ports of hardware design objects.

With the present invention, it will be appreciated that in simulation, the behavior of the system library matches that of the target library bit-for-bit and cycle-for-cycle. This means detailed hardware behavior is made manifest in the system model without needing to simulate the hardware realization itself. The mapping from system element to target element may be one-to-many, but for any parameterization in the system model, the bit and cycle behavior is an accurate representation of the corresponding hardware behavior at the sample rate defined in the system model. In the example embodiment, the designer is provided with the ability to specify in the system model the points at which and in what fashion the hardware and system behaviors should be constrained to match, up to and including the ability of the user to relax the constraint on bit-true and cycle-true correspondence. With the relaxation of constraints, it is often possible for the compiler to realize more efficient hardware (e.g., through extensive re-timing and pipelining in the event that the user requests that the data match identically, but that latency can be tailored for performance).

The compiler allows networks of system library elements to be intermingled with networks of non-system library operators (e.g., user-defined elements). The compiler resolves system-level parameters into attributes on the target library blocks, and into additional circuitry (ports, blocks, and signals) in hardware. For example, the compiler converts a sample-rate-based representation into a clocked hardware implementation, automatically inferring clock, clock enable, and clear ports and signals (not present in the system model) based on sample rates defined in the system model. In the event that an HDL simulation is desired, the compiler generates a test bench and test vectors in the system environment integrated with the generated hardware realization.

The compiler also includes customization mechanisms to tailor the hardware realization to user specifications. For example, the compiler performs architectural synthesis, in response to user controls, when mapping system blocks to target blocks.

The current invention provides the IP library embedded in the target library. The replacement of elements in the simulation model with target library elements is automatic. In one embodiment, the system library includes functions (S-functions) in the Simulink® simulation environment from The MathWorks, Inc. The target library includes VHDL modules and support packages, and the compiler translates a Simulink® model (the system model) into a hardware realization. The compiler operates on the system model in successive stages. The software components of one embodiment of the invention are written in multiple languages, each selected for accomplishing the task at hand. The system library elements are written in a combination of MATLAB code (part of the Simulink® environment), which interfaces directly to the underlying system simulation engine, and C++, which provides the benefits of object-oriented design. The compilation and simulation mechanisms chosen in this embodiment of the invention enable simulation-time customization of many system parameters (e.g., data precision). Such customization is not provided in previous approaches such as SPW or A|RT.

Figure 1B:
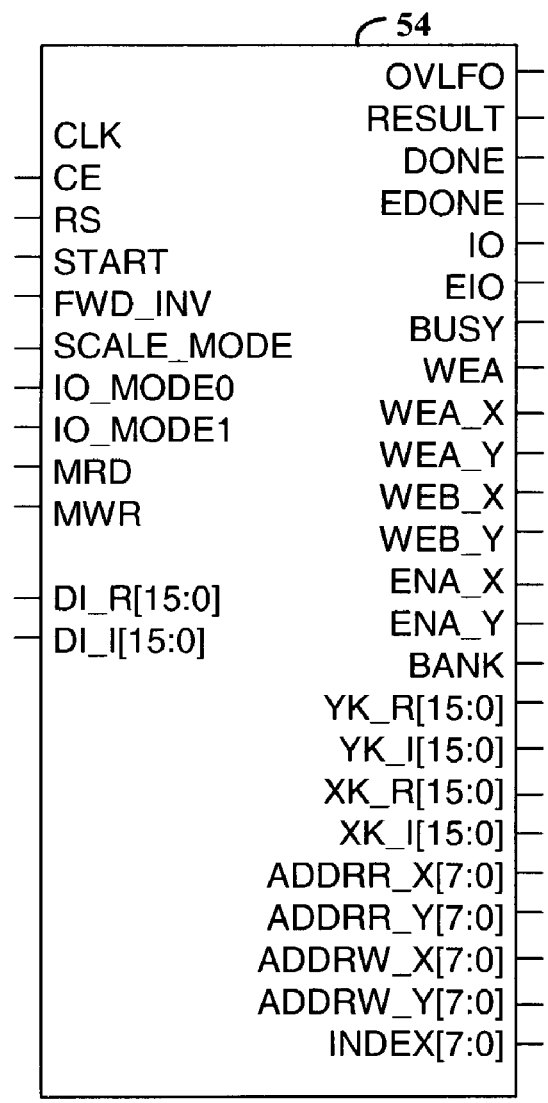

Functional operators in the system library are abstract to support ease of use. Operators in the target library are lower level, and often are highly detailed and closely tied to hardware. This makes the operators in the target library relatively complex to use. The simplicity of the system library operators makes algorithm exploration and high-level modeling practical. FIGS. 1A and 1B illustrate the difference between the fast Fourier transform (FFT) operator 52 in the system library and FFT operator 54 in the target library. It is clear that much of the detail in the hardware has been abstracted away in the system view, making the block much easier to use in practice. One of the tasks of the compiler is to bridge the gap between the system and hardware realizations of library elements.

Figure 2A:
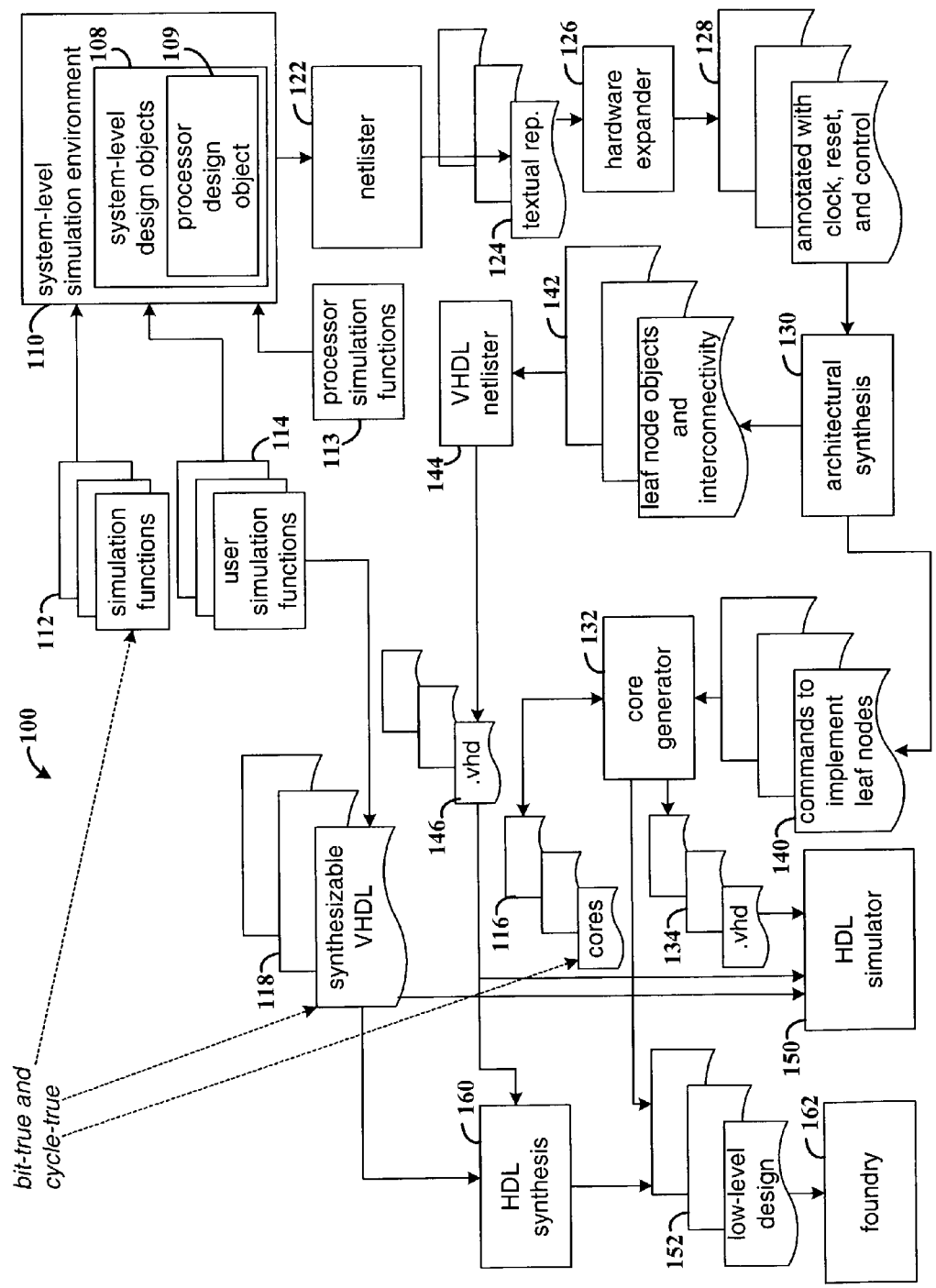
FIG. 2A is a functional block diagram of a design system structured in accordance with one embodiment of the invention.

FIG. 2A is a functional block diagram of a design system structured in accordance with one embodiment of the invention. System 100 includes the system library (block 112), an embedded processor library (block 113), and blocks that perform the phases of compilation. The compiler phases include resolving system parameters into attributes in an internal representation (block 122); expanding data types and inferring clock ports, signals, and generators (block 126); performing architectural synthesis (block 130); and netlisting into an HDL representation (block 144). The target library (block 118) provides synthesizable circuitry that wraps IP blocks (block 116) to extend the functionality, e.g., support of fixed-point data.

System 100 illustrates how a Simulink® system model is transformed by a MATLAB function (netlister) into an internal representation. This internal representation undergoes several transformations that resolve system parameters into the required control circuitry and target library mapping. In particular, data types are resolved into hardware-realizable forms, and clock signals, flip-flop clock enables and resets are inferred from system sample rates. A processor design object will typically provide an integer-based data path. The system level translation automatically resolves fixed-point data into the underlying integer-based microprocessor instructions.

It is advantageous to provide cycle-accurate modeling of hardware design objects. The processor/hardware design object interface can also be cycle-accurate, but it is also advantageous to support a sequence-accurate interface. In a sequenced interface, the data passed via a connection from a processor object to a hardware design object preserves the data sequence order, but does not necessarily accurately model in the system level simulation the actual elapsed time between data transfers. Although this mode of interaction is less accurate than a cycle-accurate simulation, it provides an abstraction that closely matches the semantics of most imperative programming languages, such as C and Java. For example, a sequence of assignments to a variable in a programming language defines a sequence of values stored in a particular memory location, but the precise clock cycles at which the assignments take place is not always a primary consideration. A sequenced interface is typically accompanied by an explicit synchronization circuit between the processor and hardware design objects. In one embodiment, the explicit synchronization circuit is a set of two memory mapped registers that implement a two-way handshake protocol between the processor design object and a hardware design object.

A user's design 108, including processor design object 109, is defined within a system-level simulation environment 110, such as Simulink®. Based on the user's design, the system-level simulator calls on simulation functions 112, along with user simulation functions 114 and processor simulation functions 113, to simulate the system-level design. The simulation functions 112, processor simulation functions 113, and user simulation functions 114 are configured to be bit-true and cycle-true relative to a hardware implementation. Thus, the bit-true and cycle-true characteristics of the simulation functions 112, 113, and 114 are reflected in the cores 116 and in the synthesizable VHDL 118, respectively. Simulation functions 112 are associated with system-provided design objects, processor simulation functions are those required to interface with the processor during simulation, and user simulation functions 114 are those provided by the user for simulating user-provided design objects.

Figure 2B:
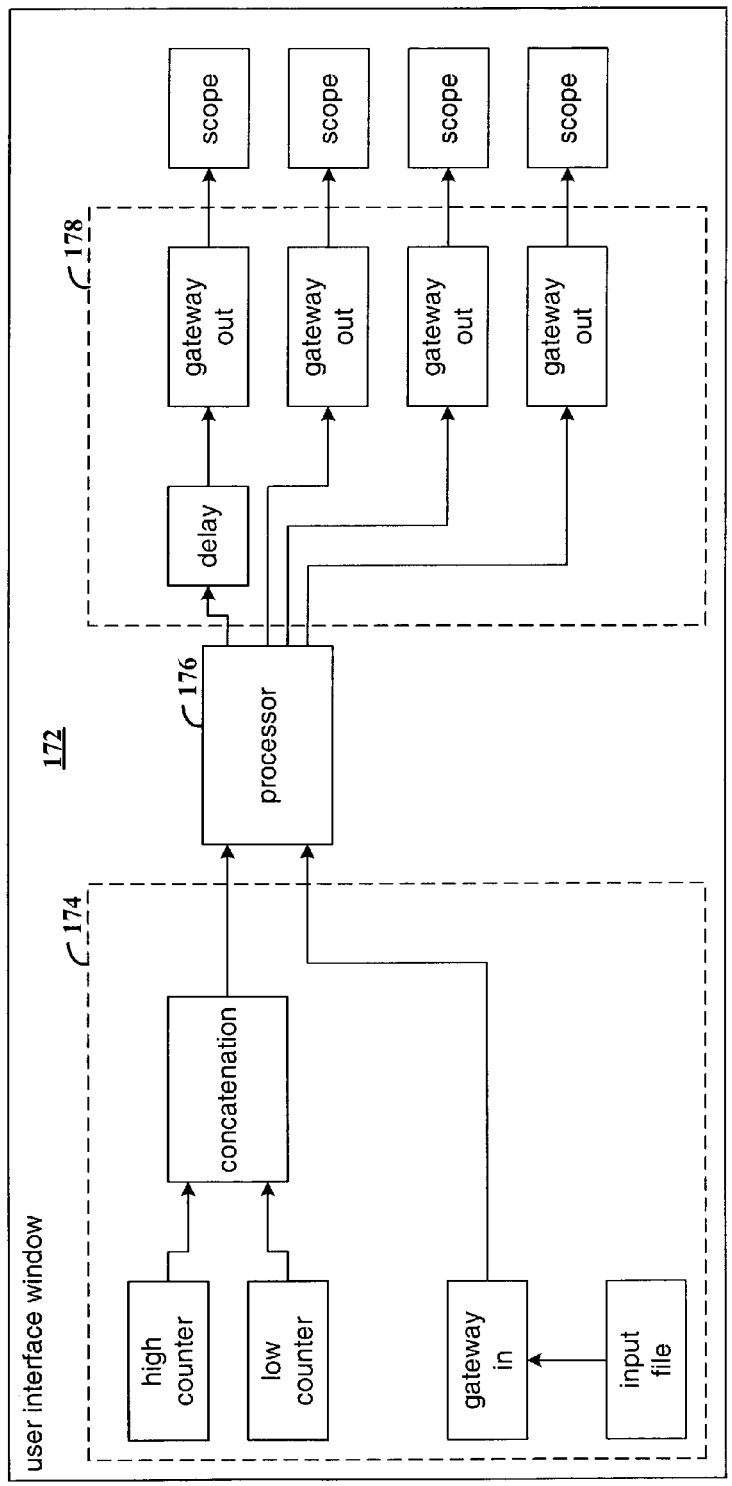
FIG. 2B illustrates a user interface window in which a system-level design of an embedded system is displayed.
Figure 2C:
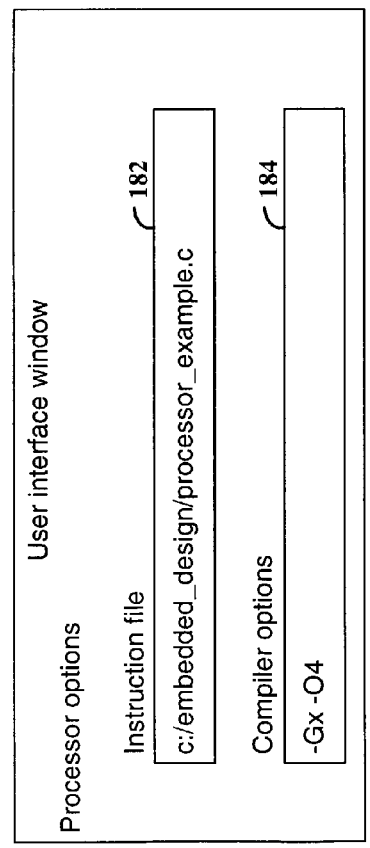
FIG. 2C illustrates a user interface window through which attributes of an embedded processor are defined.

FIG. 2B illustrates an example user interface window 172 in which a system-level design of an embedded system is displayed. Hardware section 174 provides input signals to processor 176, and hardware section 178 provides output signals to the processor. The user-specification of the processor 174 includes the size, type, and code to run on the processor (location of a program file). FIG. 2C illustrates an example user interface screen for specifying the code 182 to run on a processor along with options 184 for compiling the code. Processor blocks in general are wireable like other blocks in the design.

An embedded processor can take different forms according to the design and implementation requirements. For example, in an FPGA implementation, the processor can be implemented on the chip using cores 116 that are tailored for generating a processor. A second possibility is that the processor and FPGA can be components of a hybrid hardware device. A third is that a small processor (small word size, small instruction set) can be defined as synthesizable VHDL 118.

Returning now to FIG. 2A, in order to support simulation at the system level that is bit-true to a hardware implementation, each simulation function 112 is defined to operate on a particular data type. For example, one instance of an FFT simulation function is defined to operate on fixed-point sample data. The simulation of the system-level design is also cycle-true to the hardware implementation. The sample periods associated with the system-level design blocks are translated into clock enable signals in the hardware implementation.

In translating the system-level design 108 to a hardware implementation, netlister 122 converts the system-level design into an internal representation, for example, textual representation 124, of the design hierarchy. Also included in the textual representation are attributes of the design objects. For example, the text describing a multiplier block includes attributes that specify the precision, whether the multiplier is implemented using a serial or parallel algorithm, whether pipelining is required, and the size. The textual representation of the system-level design elements is shown as blocks 124.

The hardware expander 126 further processes the textual representation of the design by adding control circuitry, signals, and ports for clock, clock-enable, and reset signals, and generating definition files 128 in the process. In addition, the hardware expander resolves data types. The additional ports that are required for a design are created by the hardware expander. For example, the hardware expander generates clock and clock-enable ports. To resolve data types, the hardware expander identifies types that have no direct analog in hardware (e.g., fixed point) and generates a suitable hardware representation.

Ports for clock, clock enable, and reset signals are identified as follows. In the system-level design 108 there are no explicit clocks. However, each object in the design outputs results at a sample rate that depends on the function of the object and on the sample rates of input data to the object. Hardware expander 126 performs the following operations in annotating the design with clock, clock-enable, and reset ports.

First, the hardware expander determines the sample rates that have been specified for every port on every object and then calculates the GCD (greatest common divisor) of these values. A period p=g/r is assigned to each port, where r is the port's sample rate and g is the GCD. Each period is a positive integer, and there is at least one port whose period equals 1.

Second, the hardware expander determines which clock signals are needed for the netlist by looking at the number of distinct periods assigned to ports. For example, if the set of periods assigned to ports is {1, 2, 3}, then the netlist must contain three clock signals with periods of 1, 2, and 3. There is always a clock that runs with period 1, which is referred to as the system clock. In hardware, every clock is derived from the system clock.

Third, the hardware expander determines which of the clock signals to assign to each of the design objects by looking at the periods associated with the object's ports. If, for example, an object has ports with periods 1 and 2, then clock, reset, and clock-enable signals corresponding to periods 1 and 2 must be attached to the object. The wiring pattern is inferred from the distribution of sample periods amongst the ports. No clocks are assigned to combinatorial logic objects.

Finally, the hardware expander adds one or more clock-generating components to the design; adds clock, reset, and clock-enable ports to the intermediate levels of the hierarchy; adds clock, reset, and clock-enable nets to each level; and then connects the clock generator, the newly added ports, and nets.

For resolving data types, the hardware expander identifies system data types, for example, fixed-point and floating-point data types, that have no direct correspondence in hardware and generates suitable hardware to accommodate the specified data types.

Architectural synthesis block 130 inputs the annotated design objects 128 and identifies specific logic cores 116 that are to be used by core generator 132 in generating VHDL files 134 for hardware simulation. Architectural synthesis block 130 also identifies additional supporting hardware that may be needed by a system-level design object. Thus, all the "leaf nodes" of the design are identified by architectural synthesis block 130. For example, an FFT object may require memory banks along with the logic that implements the function. The architectural synthesis block outputs commands 140 that are input to core generator 132, which generates VHDL for the identified leaf nodes of the design.

Architectural synthesis block 130 also generates descriptions of the connectivity between the leaf nodes of the design. The leaf nodes of the design and the defined interconnectivity descriptions are stored as files 142.

After architectural synthesis, all of the design hierarchy and mapping to target library elements are known. To facilitate a high-performance implementation, a constraint file (not shown) is generated to provide constraints for the subsequent synthesis, technology mapping, placement and routing phases of an implementation. One important constraint is to specify a timing budget that should be met when implementing critical paths in the design. In the synchronous scheme described above, every flip-flop runs at a single rate, which must be fast enough to meet the overall performance requirements. However, in a multi-rate design, not every path needs to run at this rate, since flip-flop activity occurs only under the control of the clock enable signal driving the flip-flop. A multi-cycle path constraint is therefore created for every path that corresponds to logic running at a slower rate.

VHDL netlister 144 creates wrapper VHDL files 146 that provide the structural definition and interconnectivity of the hardware design. VHDL files 146 also define the testbench for hardware simulation.

Testbench generation can be requested by a user at the time the user initiates generation of the hardware implementation with the netlister 122. To generate a hardware simulation testbench, the system-level simulation is translated into a VHDL file 146. At the system simulation level, simulation data are generated by "source functions" that are provided with the simulator and that are parameterizable by the user. For example, one source function might be a sine wave generator, which supplies a stream of values conforming to a sine wave, and an associated parameter is the frequency of the sine wave. While the system-level simulator 110 is running, the input values to the source functions are stored in a data file. The system-level simulation data files are then used to create hardware testbench data files and VHDL for inputting the data.

In one implementation, cores 116 are executable programs that are called on by core generator 132 to generate VHDL files 134 for use by HDL simulator 150 and to generate hardware-specific, low-level design files 152. An embodiment of a core generator is provided in the CoreGen software from Xilinx.

HDL simulator 150 performs hardware-level simulation on the hardware-level design as set forth in the VHDL files 134 and user-supplied VHDL files 118, with testbench data provided by VHDL files 146. HDL synthesis block 160 and foundry block 162 represent functional components in a conventional HDL design flow.

The functions of the processor of an embedded system can be simulated in a number of different ways. In one embodiment, the processor itself is simulated in executing the designated program code. In another embodiment, an actual processor may be used to execute the code while simulating the rest of the hardware. In the various embodiments, a software debugger provides the ability to view the internal state of processor, including the current instruction, register states, memory contents, etc.

System 100 supports integration of user-provided, system-level design objects with vendor-provided design objects in a system-level design 108. Where the user has provided synthesizable VHDL files 118 that implement user-defined system-level objects, the bit-true and cycle-true simulation of the system-level design that includes the user-provided objects can be performed. The user-provided objects are tagged as "black boxes" in the system-level design, and are not subject to the core generator implementation operations that are performed for the system-provided objects.

FIG. 3A is a block diagram of an example system-level design of an electronic circuit, and FIG. 3B is a block diagram of a hardware implementation generated from the system-level design. System 200 is a multi-rate filter arrangement and includes input register 202, up-sampler 204, FIR filter 206, down-sampler 208, and output register 210. Input sample values are up-sampled by a factor of two, filtered, and then down-sampled by a factor of three. The overall sample rate conversion for system 200 is 2/3.

The sample rates that are specified at the system level are 48 kHz for input to register 202, 96 kHz for output from up-sampler 204 and input to FIR filter 206, and 96 kHz for output from down-sampler 208 and input to register 210. The normalized periods are determined to be 2, 1, and 3, respectively, as determined by the hardware expander 126, for example.

Gateway design objects 240 and 242 define the input and output boundaries of system 200, respectively. Gateway-in objects are design objects used for an input interface, and gateway-out objects are design objects used for an output interface. The simulation function associated with the gateway-in object captures input simulation data, and the simulation function associated with the gateway-out object captures output simulation data.

FIG. 3B illustrates a hardware implementation 250 of the system-level design shown in FIG. 2A. Register 252 corresponds to system object 202, block 254 correspond to system up-sampler 204, block 256 corresponds to system FIR filter 206, block 258 corresponds to system down-sampler 208, and register 260 corresponds to system object 210. The example illustrates the generation of clock-enable ports and clock control circuitry in the hardware design based on the information in the system-level design.

Hardware component 270 is a control circuit that generates clock-enable signals to accommodate the sample periods of 1, 2, and 3. The system clock signal is input at the CLK port, and the system clock-enable signal is input at the CE port. The system clock-enable signal is also connected to the CE port of filter component 256 to implement the sample period of 1. The clock-enable signal at output port CE2 of component 270 is connected to the CE2 input ports of input register 252 and up-sampler 254 to implement the sample period of 2. The clock-enable-signal at output port CE3 is connected to the CE3 input ports of down-sampler 258 and register 260 to implement the sample period of 3.

Even though it is not shown, it will be appreciated that some of the system-level objects may be implemented in the hardware-level design with multiple hardware components. For example, FIR filter 206 in the system design includes one or more memory modules that are used in conjunction with adders and multipliers.

Having described the gateway-in and gateway-out design objects, further details regarding system-level simulation, testbench creation, and hardware-level simulation are set forth in the following paragraphs. During system-level simulation, data samples flow into the gateway-in objects and out of the gateway-out objects at regular sample periods. The input values are the stimuli, and the output values are the responses. The input samples that are captured during system-level simulation can be used for the hardware-level simulation. The faithfulness of the hardware representation can be demonstrated in that if the stimuli in the hardware-level simulation are the same as the stimuli in the system-level simulation, the responses from the hardware-level simulation will be the same as the responses from the system-level simulation. The values presented at the input ports in the hardware-level simulation and produced at the output ports are bit vectors, which represent the fixed-point values from the system-level simulation.

The gateway-in objects in the system-level design are translated into VHDL components by the core generator 132 and cores 116. The VHDL components for the gateway-in objects read the input data that was captured during system-level simulation and input the data to the hardware-level design components, for example to register 252 of FIG. 3B. Gateway-out objects are translated into VHDL components that compare hardware-level simulation results, for example, from register 260, to expected results, as captured during system-level simulation.

The fixed-point data type of the system-level generator 110 (e.g., Simulink) is represented using a std_logic_vector in VHDL. The position of the binary point, size of the container, and treatment of sign are supplied to the VHDL as generic parameters. To ease interpretation of fixed-point types in VHDL, the gateway objects convert the std_logic_vector into a VHDL real number by using the generic parameter information. A sequence of real numbers can be viewed as an analog waveform in an HDL simulator such as ModelSim from Model Technology, Inc. This allows the user to view results in the same format as with the system-level simulator.

What is claimed is:

1. A computer-implemented method for creating an electronic circuit design, comprising:
providing a plurality of user-selectable system-level design objects, wherein each system-level design object is defined by a system-level function, is parameterizable, and has at least one input data port, at least one output data port, and a clock-enable port, and each input and output data port has an associated, user-specified sample rate;
providing a plurality of hardware-level design objects, each hardware-level design object configured to generate a hardware definition of a hardware-level function, wherein one or more hardware-level design
objects are combinable to implement each system-level
design object;
providing a user-selectable processor design object that
defines a processor;
instantiating a system-level design in a system-level
design file in response to user control signals, the
system-level design including user-selected ones of the
system-level design objects and the processor design
object;
simulating behavior of the system-level design consistent
with the processor, the system-level functions and
behavior of a hardware definition from the hardware-
level design objects that implement the user-selected
ones of the system-level design objects; and
in response to a signal to generate a hardware-level design
from the system-level design file, generating a clock
control hardware definition that includes an output port
with a clock rate for each different sample rate, wherein
each clock control output port is coupled to the clock-
enable port of each system-level design object having
an input data port with a sample rate equal to the clock
rate of the clock control output port; and generating
hardware definitions for the hardware-level design
objects that implement each user-selected system-level
design object.

2. The method of claim 1, further comprising generating
a hardware implementation from the system-level design
that includes the processor design object and system-level
design objects, which are implemented with the hardware-
level design objects.

3. The method of claim 2, further comprising:
in response to a signal to generate a hardware-level design
from the system-level design file,
supplementing the system-level design objects with
clock-clear and clock-enable ports.

4. The method of claim 3, further comprising:
simulating behavior of the system-level design with user-
specified input-data generators that generate system-
level input data;
capturing the system-level input data generated by the
input-data generators; and
generating a hardware definition for a first testbench
component that provides the system-level input data as
input data to the hardware definitions.

5. The method of claim 4, further comprising simulating
behavior of the design defined by the processor design
object, hardware definitions, and the testbench component.

6. The method of claim 5, further comprising:
capturing system-level output data generated during
simulation of the system-level design;
generating a hardware definition for a second testbench
component that compares output data generated during
simulation of the design defined by the hardware defi-
nitions to output data captured during simulation of the
system-level design.

7. The method of claim 2, further comprising:
simulating behavior of the design defined in the system-
level design file with user-specified input-data genera-
tors that generate system-level input data;
capturing the system-level input data generated by the
input-data generators; and
generating a hardware definition for a first testbench
component that provides the system-level input data as
input data to the hardware definitions.

8. The method of claim 7, further comprising simulating
behavior of the design defined by the hardware definitions
and the testbench component.

9. The method of claim 8, further comprising:
capturing system-level output data generated during
simulation of the design defined in the system-level
design file;
generating a hardware definition for a second testbench
component that compares output data generated during
simulation of the design defined by the hardware defi-
nitions to output data captured during simulation of the
design defined in the system-level design file.

10. An apparatus for creating an electronic circuit design,
comprising:
means for providing a plurality of user-selectable system-
level design objects, wherein each system-level design
object is defined by a system-level function, is param-
eterizable, and has at least one input data port, at least
one output data port, and a clock-enable port, and each
input and output data port has an associated, user-
specified sample rate;
means for providing a plurality of hardware-level design
objects, each hardware-level design object configured
to generate a hardware definition of a hardware-level
function, wherein one or more hardware-level design
objects are combinable to implement each system-level
design object;
means for providing a user-selectable processor design
object that defines a processor;
means for instantiating a system-level design in a system-
level design file in response to user control signals, the
system-level design including user-selected ones of the
system-level design objects and the processor design
object;
means for simulating behavior of the system-level design
consistent with the processor, the system-level func-
tions and behavior of a hardware definition from the
hardware-level design objects that implement the user-
selected ones of the system-level design objects; and
means, responsive to a signal to generate a hardware-level
design from the system-level design file, for generating
a clock control hardware definition that includes an
output port with a clock rate for each different sample
rate, wherein each clock control output port is coupled
to the clock-enable port of each system-level design
object having an input data port with a sample rate
equal to the clock rate of the clock control output port,
and for generating hardware definitions for the hard-
ware-level design objects that implement each user-
selected system-level design object.

11. The apparatus of claim 10, further comprising means
for generating a hardware implementation from the system-
level design that includes the processor design object and
system-level design objects, which are implemented with
the hardware-level design objects.

12. The apparatus of claim 11, further comprising
means for supplementing the system-level design objects
with clock-enable and clock-clear ports responsive to
the signal to generate a hardware-level design from the
system-level design file.

13. A system for creating an electronic circuit design,
comprising:
a plurality of user-selectable system-level design objects,
wherein each system-level design object is defined by
a system-level function, is parameterizable, and has at
least one input data port, at least one output data port, and a clock-enable port, and each input and output data port has an associated, user-specified sample rate;

at least one user-selectable processor design object that defines a processor;

a plurality of hardware-level design objects, each hardware-level design object configured to generate a hardware definition of a hardware-level function, wherein one or more hardware-level design objects are combinable to implement each system-level design;

a system-level simulation environment configured to instantiate a system-level design in a system-level design file, the system-level design including user-selected ones of the processor design object, system-level design objects, and simulate behavior of the system-level design consistent with the processor, system-level functions, and behavior of a hardware definition from the hardware-level design objects that implement the user-selected ones of the system-level design objects; and a translator coupled to the system-level simulation environment, the translator configured to, in response to a signal to generate a hardware-level design from the system-level design file, generate a clock control hardware definition that includes an output port with a clock rate for each different sample rate, wherein each clock control output port is coupled to the clock-enable port of each system-level design object having an input data port with a sample rate equal to the clock rate of the clock control output port, and the translator further configured to generate hardware definitions for the hardware-level design objects that implement each user-selected system-level design object.

14. The system of claim 13, is further configured to, responsive to the signal to generate a hardware-level design from the system-level design file, supplement the system-level design objects with clock-enable and clock-clear ports.

15. The system of claim 14, wherein the system-level simulation environment is configured to:

simulate behavior of the system-level design with user-specified input-data generators that generate system-level input data;

capture the system-level input data generated by the input-data generators; and generate a hardware definition for a first testbench component that provides the system-level input data as input data to the hardware definitions.

16. The system of claim 15, wherein the system-level simulation environment is configured to:

capture system-level output data generated during simulation of the system-level design; and generate a hardware definition for a second testbench component that compares output data generated during simulation of the design defined by the hardware definitions to output data captured during simulation of the system-level design.

* * * * *